(12) United States Patent
Shiozawa

(10) Patent No.: US 6,984,125 B2
(45) Date of Patent: Jan. 10, 2006

(54) APPARATUS FOR MANUFACTURING ELECTRONIC DEVICE, METHOD OF MANUFACTURING ELECTRONIC DEVICE, AND PROGRAM FOR MANUFACTURING ELECTRONIC DEVICE

(75) Inventor: Masakuni Shiozawa, Chino (JP)

(73) Assignee: Seiko Epson Corporation (JP)

( * ) Notice: Subject to any disclaimer, the term of this patent is extended or adjusted under 35 U.S.C. 154(b) by 33 days.

(21) Appl. No.: 10/394,493

(22) Filed: Mar. 21, 2003

(65) Prior Publication Data

US 2004/0002227 A1 Jan. 1, 2004

(30) Foreign Application Priority Data

| Mar. 22, 2002 | (JP) | ........................... 2002-081223 |
| Jan. 31, 2003 | (JP) | ........................... 2003-024651 |

(51) Int. Cl.
F27B 9/28 (2006.01)

(52) U.S. Cl. .................. 432/121; 432/59; 432/143; 219/395; 219/444.1

(58) Field of Classification Search ................ 432/33, 432/143, 121, 128, 135, 8, 59; 219/444.1, 219/388, 390, 443.1, 394, 395; 257/668, 257/676, 688, 694, 737, 738, 739, 774, 778
See application file for complete search history.

(56) References Cited

U.S. PATENT DOCUMENTS

| 4,833,301 | A | * | 5/1989 | Furtek ......................... 219/388 |
| 4,973,243 | A | * | 11/1990 | Deambrosio et al. ........... 432/8 |
| 5,370,531 | A | * | 12/1994 | Tsurumi et al. .............. 432/242 |
| 5,372,648 | A | * | 12/1994 | Yamamoto et al. ....... 118/723 E |
| 5,770,835 | A | * | 6/1998 | Sakuyama et al. .......... 219/388 |
| 6,097,005 | A | * | 8/2000 | Akimoto .................... 219/444.1 |
| 6,168,064 | B1 | * | 1/2001 | Berkin ............................. 228/9 |
| 6,386,422 | B1 | * | 5/2002 | Cheng et al. .................. 228/46 |
| 6,639,189 | B2 | * | 10/2003 | Ramanan et al. ......... 219/444.1 |

FOREIGN PATENT DOCUMENTS

| JP | 06-045405 | 2/1994 |
| JP | 06-163646 | 6/1994 |
| JP | 10-135278 | 5/1998 |
| JP | 2001-308512 | 11/2001 |

OTHER PUBLICATIONS

Communication from Japanese Patent Office re: counterpart application 2003-024649.
Communication from Japanese Patent Office re: counterpart application 2003-024650.
Communication from Korean Patent Office re: counterpart application.

* cited by examiner

Primary Examiner—Gregory Wilson
(74) Attorney, Agent, or Firm—Harness, Dickey & Pierce, P.L.C.

(57) ABSTRACT

A reflow process is provided for multiple units which improves productivity. A reflow furnace is moved along a transport direction of a tape substrate and is fixed at a position matching the product pitch of a circuit substrate. Any of a plurality of heating blocks and cooling blocks are matched to the product pitches of the circuit substrate. By doing so, it is possible to continuously carry out the reflow process for a tape substrate on which circuit substrates having different product pitches are arranged.

9 Claims, 8 Drawing Sheets

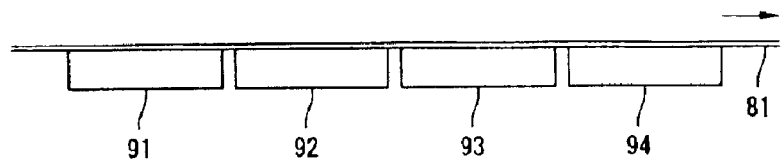
FIG.6 (a)
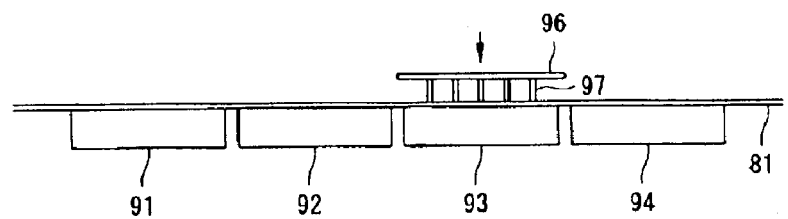
FIG.6 (b)
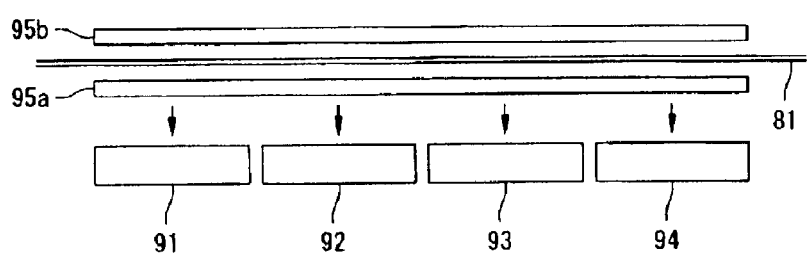
FIG.6 (c)
FIG.6 (d)
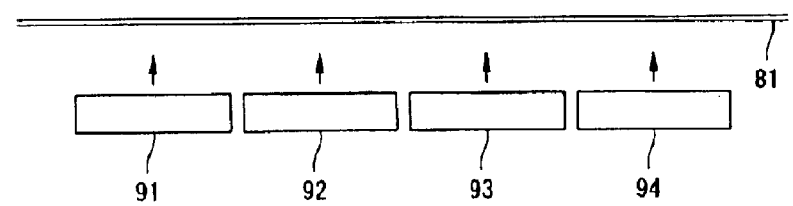
FIG.6 (e)
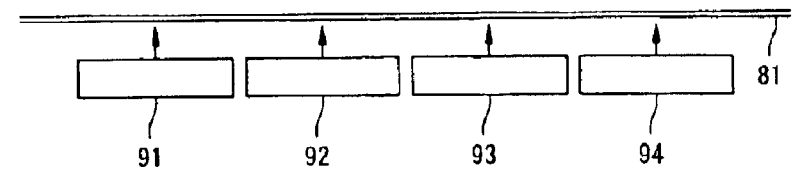
FIG.6 (f)
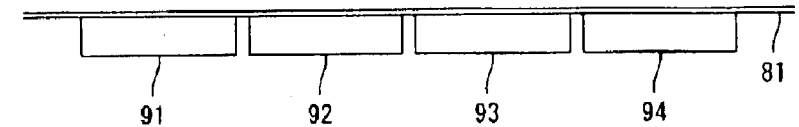

PRIOR ART

APPARATUS FOR MANUFACTURING ELECTRONIC DEVICE, METHOD OF MANUFACTURING ELECTRONIC DEVICE, AND PROGRAM FOR MANUFACTURING ELECTRONIC DEVICE

BACKGROUND

1. Technical Field of the Invention

The present invention relates to an apparatus for manufacturing an electronic device, a method of manufacturing an electronic device, and a program for manufacturing an electronic device, which are specifically applicable to a solder reflow process by which electronic components are mounted on a tape substrate.

2. Description of the Related Art

In manufacturing a semiconductor device, there is a process for mounting, for example semiconductor chips on a circuit substrate of a COF (Chip On Film) module, a TAB (Tape Automated Bonding) module, and others, by a reflow method.

FIG. 8 is a view illustrating the conventional method of manufacturing an electronic device.

As shown in FIG. 8, during the reflow process, there are provided heater zones 111 to 113 and a cooling zone 114 along the right arrow in the transport direction of a tape substrate 101. Here, during the reflow process, if peak heat is suddenly applied, reflow cracks may be generated in a bonding member such as an adhesive between the tape substrate 101 and a semiconductor chip or the semiconductor chip itself, or solder bonding by the solder paste may not be carried out well. For this reason, preheating is applied in the heater zones 111, 112 and the peak heat is applied in the heater zone 113. The peak heat is indicated by a solder melting point+α. Furthermore, the reflow method in the reflow process can employ an air-heating method using the hot-air circulating method, a lamp heating method, a far infrared ray method and others.

When terminals of the semiconductor chip are bonded onto the wires of the circuit substrate by means of melting the solder paste, the semiconductor chip is fixed on the circuit substrate by means of cooling in the cooling zone 114. In the cooling zone 114, a method of circulating low temperature air has been studied.

When the reflow process is carried out on the tape substrate 101, the reflow process may be carried out on a tape substrate 101 in which circuit substrates having different product pitches are arranged. The product pitch means a mounting interval of ICs and the like mounted on the circuit substrates. In this case, the processing time in each heater zone 111 to 113 corresponds to each product pitch.

However, in the method of matching the processing time in each heater zone 111 to 113 to each product pitch, every time the product pitches are different, the processing time in each heater zone 111 to 113 has to be set, thus hindering improvements in productivity.

For example, spot heating may be carried out in correspondence with each product pitch by employing a laser heating method, but since the heating process using laser heating is partial at best, the heating cannot be carried out on several units simultaneously.

Therefore, an object of the present invention is to provide an apparatus for manufacturing an electronic device, a method of manufacturing an electronic device and a program for manufacturing an electronic device in which a reflow process can be carried out on several units and improved productivity can be accomplished.

SUMMARY OF THE INVENTION

In order to solve the aforementioned problems, an apparatus for manufacturing an electronic device according to an aspect of the present invention comprises: a heat generating means for raising a temperature of an area to be heated by controlling a distance to the area of a continuous body to be heated, in which an electronic component mounting area is provided on every circuit block; and a position control means for controlling a position of the heat generating means on the basis of a product pitch of the area to be heated.

By doing so, it is possible to easily control the heating condition of the area to be heated and to easily change the heating position of the area to be heated by controlling the distance between the area to be heated and the heat generating means.

For this reason, even when the product pitches of the circuit blocks are different from each other, it is possible to carry out the reflow process on the area to be heated in the circuit block unit, to accurately control the temperature profile in the circuit blocks while suppressing deterioration of production efficiency, and to improve the product quality in the reflow process.

In an apparatus for manufacturing an electronic device according to an aspect of the present invention, the heat generating means raises the temperature of the area to be heated by approaching or contacting at least a part of the area of the continuous body to be heated.

By doing so, it is possible to control the heating condition of the area to be heated by using radiant heat or conductive heat and to suppress circumferential dissipation of heat generated from the heat generating means. For this reason, it is possible to accurately control the temperature profile in the circuit block unit and to easily carry out quality control. In addition, the shielding structure of the hot-air circulating method or the light-shielding structure of the lamp heating method or the far infrared ray method is not required, and therefore it is possible to reduce the space needed.

Furthermore, by contacting the heat generating means, with the area of the continuous body to be heated, it is possible to rapidly raise the temperatures of the circuit blocks and to easily change the heating position of the area to be heated by changing the contact position of the heat generating means. For this reason, even when the product pitches of the circuit blocks are different from each other, it is possible to shorten the tact time in transporting and to adjust and/or align the transport tact in the solder applying process or the mounting process and the transport tact in the reflow process. Thus, it is possible to carry out the solder applying process, the mounting process of electronic components and the reflow process simultaneously.

Furthermore, in an apparatus for manufacturing an electronic device according to an aspect of the present invention, the heat generating means has a plurality of contact areas having different predetermined temperatures, and the heat generating means raises the temperature of the area to be heated step-by-step by sequentially contacting the contact areas with the area to be heated.

By doing so, it is possible to control the heating condition of the area to be heated by using the conductive heat and to raise the temperature of the area to be heated step-by-step while suppressing circumferential dissipation of heat generated from the heat generating means. For this reason, without employing the shielding structure used in the hot-air circulating method or the light-shielding structure used in the lamp heating method or the far infrared ray method, it is possible to control the temperature profile step-by-step in the circuit block unit and to reduce the space needed and easily perform quality control.

Furthermore, by having the heat generating means sequentially approach the area to be heated, it is possible to rapidly raise the temperature of the circuit block step-by-step and to shorten the tact time in transporting while preventing sudden temperature changes of the area to be heated. For this reason, it is possible to adjust and/or align the transport tact in the solder applying process or in the mounting process and the transport tact in the reflow process while suppressing the deterioration in quality in the reflow process and to carry out the solder applying process, the mounting process of the electronic components and the reflow process simultaneously.

Furthermore, in an apparatus for manufacturing an electronic device according to an aspect of the present invention, the heat generating means has a plurality of contact areas having different lengths corresponding to a plurality of product pitches, and the contact areas are selected in correspondence with the product pitches.

By doing so, even when the product pitches of the circuit blocks are different from each other, it is possible to contact the heat generating means, with the area to be heated in the circuit block unit, to accurately control the temperature profile for every circuit block and to improve the product quality in the reflow process.

Furthermore, in an apparatus for manufacturing an electronic device according to an aspect of the present invention, the plurality of contact areas having different predetermined temperatures are arranged in parallel along a transport direction of the continuous body.

By doing so, while transporting the continuous body, it is possible to sequentially contact the area to be heated with the plurality of contact areas having different predetermined temperatures, to raise the temperature of the area to be heated step-by-step without moving the heat generating means, and to carry out the reflow process on the plurality of areas to be heated simultaneously.

For this reason, it is possible to shorten the tact time in the reflow process while preventing sudden changes in temperature of the area to be heated and to efficiently carry out the reflow process while maintaining product quality.

Furthermore, an apparatus for manufacturing an electronic device according to an aspect of the present invention further comprises temperature lowering means for lowering the temperature of the area to be heated which was raised by the heat generating means.

By doing so, it is possible to rapidly lower the temperature of the area to be heated which was raised by the heat generating means, to improve the solder wettability to stabilize the bonding and to prevent the thermal oxidation of solder.

Additionally, in an apparatus for manufacturing an electronic device according to an aspect of the present invention, the temperature lowering means comprises an area having a temperature lower than that of the heat generating means, and the temperature lowering means lowers the temperature of the area to be heated by contacting the lower temperature area with at least a part of the area of the continuous body to be heated.

By doing so, it is possible to control the cooling condition of the area to be heated by using conductive heat, and to shorten the cooling time by improving cooling efficiency.

For this reason, it is possible to shorten the tact time in cooling, and to suppress the deterioration of the product quality and to efficiently carry out the reflow process by suppressing the thermal oxidation of solder.

Furthermore, in an apparatus for manufacturing an electronic device according to an aspect of the present invention, the lower temperature area has a plurality of contact areas having different lengths corresponding to the plurality of product pitches, and the temperature lowering means selects the contact areas in correspondence to the product pitches.

As a result, even when the product pitches of the circuit blocks are different from each other, it is possible to contact the lower temperature area with the area to be heated in the circuit block unit. For this reason, it is possible to accurately control the temperature profile in each circuit block and to improve the product quality in the reflow process while suppressing the deterioration of production efficiency.

Furthermore, a method of manufacturing an electronic device according to an aspect of the present invention comprises steps of: controlling a position of a heat generating means based on a product pitch of an area of a continuous body to be heated, in which an electronic component mounting area is provided on every circuit block; and raising a temperature of the area to be heated by controlling a distance between the heat generating means and the area to be heated.

By doing so, by controlling the distance between the area to be heated and the heat generating means, it is possible to easily control the heating condition of the area to be heated and to easily change the heating position of the area to be heated.

For this reason, even when the product pitches of the circuit blocks are different from each other, it is possible to shorten the tact time in the reflow process, to carry out the reflow process on the area to be heated in the circuit block unit and to efficiently carry out the reflow process while suppressing the deterioration of quality in the reflow process.

Furthermore, a method of manufacturing an electronic device according to an aspect of the present invention further comprises a step of adjusting the length of the heat generating means to match the product pitch.

By doing so, even when the product pitches of the circuit blocks are different from each other, it is possible to contact the heat generating means, with the area to be heated in the circuit block unit and to uniformly carry out the heating on each circuit block.

Furthermore, a method of manufacturing an electronic device according to an aspect of the present invention further comprises a step of lowering the temperature of the area to be heated by contacting at least a part of the area to be heated which was raised by the heat generating means, with an area having a temperature lower than that of the heat generating means.

By doing so, it is possible to control the heating condition of the area to be heated by using radiant heat or conductive heat and to suppress the circumferential dissipation of heat generated from the heat generating means. For this reason, it is possible to accurately control the temperature profile in the circuit block unit and to easily perform quality control. In addition, the shielding structure used in the hot-air circulating method or the light-shielding structure used in the lamp heating method or the far infrared ray method is not required, and therefore it is possible to reduce the space needed.

Furthermore, by contacting the heat generating means, with the area of the continuous body to be heated, it is possible to rapidly raise the temperature of the circuit block, to shorten the tact time in transporting and to easily change the heating position of the area to be heated. For this reason, even when the product pitches of the circuit blocks are different from each other, it is possible to adjust and/or align the transport tact in the solder applying process or the mounting process and the transport tact in the reflow process and to carry out the solder applying process, the mounting process of the electronic component and the reflow process simultaneously.

Furthermore, a program for manufacturing an electronic device according to an aspect of the present invention allows a computer to carry out the steps of: setting the product pitches of an area of a continuous body to be heated, in which an electronic component mounting area is provided on every circuit block; and raising the temperature of the area to be heated by controlling a distance to the area to be heated on the basis of the product pitch of the area to be heated.

By installing the program for manufacturing an electronic device, even when the product pitches of the circuit blocks are-different from each other, it is possible to appropriately control the distance between the area of the continuous body to be heated and the heat generating means, and to efficiently manufacture various electronic devices while suppressing the thermal damage in reflow.

BRIEF DESCRIPTION OF THE DRAWINGS

FIGS. 6(a)–6(f) are views illustrating the reflow process of FIG. 5.

DETAILED DESCRIPTION

An apparatus for manufacturing an electronic device and a method of manufacturing an electronic device in accordance with the embodiments of the present invention will be described with reference to the drawings.

Figure 1:
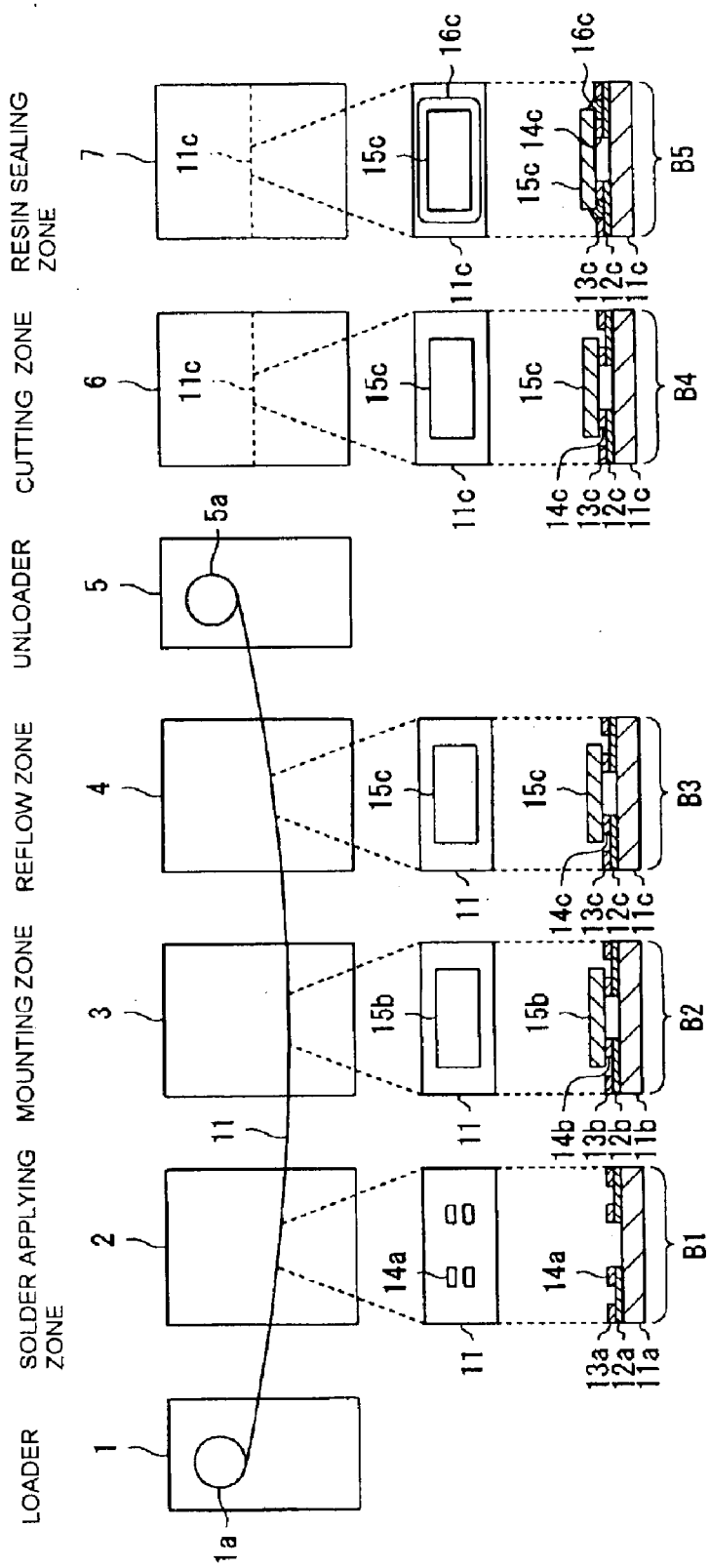
FIG. 1 is a view illustrating a method of manufacturing an electronic device according to a first embodiment of the present invention.

FIG. 1 is a view illustrating a method for manufacturing an electronic device in accordance with a first embodiment of the present invention.

In FIG. 1, a solder applying zone 2, a mounting zone 3, and a reflow zone 4 are sequentially aligned in the transport direction of a tape substrate 11 between a loader 1 and an unloader 5.

In addition, on the tape substrate 11, electronic component mounting areas are provided on every circuit block B1 to B3, and each circuit block B1 to B3 is provided with circuit substrates 11a to 11c. Each wiring 12a to 12c is formed on each circuit substrate 11a to 11c, the terminal portions of the wirings 12a to 12c are exposed, and each insulating layer 13a to 13c is formed on each wiring 12a to 12c.

The tape substrate 11, on which the circuit substrates 11a to 11c having predetermined lengths are arranged in a line, extends between an unwinding reel 1a and a take-up reel 5a. In each transport tact of the tape substrate 11, a solder non-applied area of tape substrate 11 is carried to the solder applying zone 2 provided between the loader 1 and the unloader 5, a solder applying-finished area of tape substrate 11 is carried to a mounting zone 3 which is arranged in parallel with the solder applying zone 2, and the mounting-finished area of the tape substrate 11 is carried to a reflow zone 4 which is arranged in parallel with the mounting zone 3.

In the solder applying zone 2, a solder paste 14a is printed on the circuit substrate 11a, and in the mounting zone 3, a semiconductor chip 15b is mounted on the circuit substrate 11b on which the solder paste 14b is printed, and in the reflow zone 4, a reflow process for the circuit substrate 11c on which a semiconductor chip 15c is mounted, is performed so that the semiconductor chip 15c is fixed on the circuit substrate 11c by a solder paste 14c.

When the solder applying process, the mounting process, and the reflow process for all the circuit blocks B1 to B3 are finished, the tape substrate 11 is cut into the respective circuit blocks B1 to B3 in a cutting zone 6. Each cut circuit block B1 to B3 is then moved into a resin sealing zone 7. Here, for example, a sealing resin 16c is applied to the circumferential portions of the semiconductor chip 1c so that the circuit block B3 can be resin-sealed.

By doing so, the tape substrate 11 is only carried once between the unwinding reel 1a and take-up reel 5a making it possible to complete the solder applying process, the mounting process, and the reflow process for the circuit substrates 11a to 11c. It is also possible to simultaneously perform the solder applying process, the mounting process, and the reflow process for different circuit substrates 11a to 11c, and it is possible to raise production efficiency.

For example, when the patterns of the wirings 12a to 12c of each circuit block B1 to B3 are changed or the types of electronic components mounted on each circuit substrate 11a to 11c are changed so that the product pitches of the tape substrate 11 are changed, the size of the solder applying area printed in the solder applying zone 2 can be changed to correspond to the product pitches. Also, when the product pitches of the tape substrate 11 are changed, the position of the reflow zone 4 can be changed to correspond to the product pitch.

By doing so, even though the product pitches of the circuit blocks B1 to B3 are different, it is possible to perform the reflow process in units of the circuit blocks B1 to B3, and to accurately control the temperature profile in each circuit block B1 to B3 so that product quality can be enhanced in the reflow process.

Figure 2:
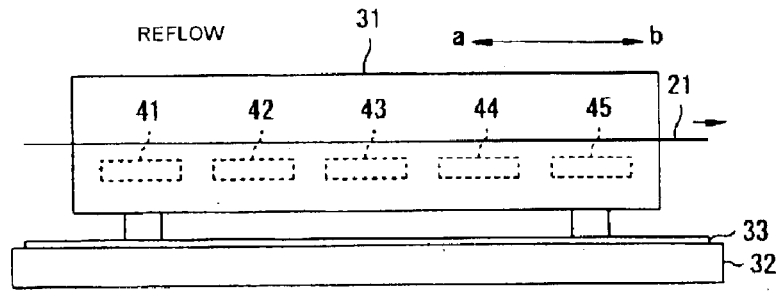
FIGS. 2(a)–2(c) are views illustrating a method of manufacturing an electronic device according to a second embodiment of the present invention.
Figure 2:
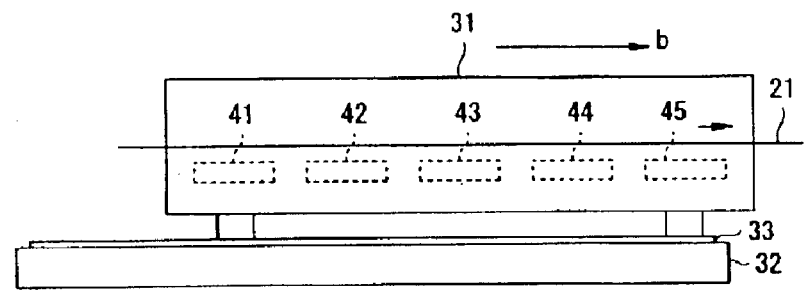
Figure 2:
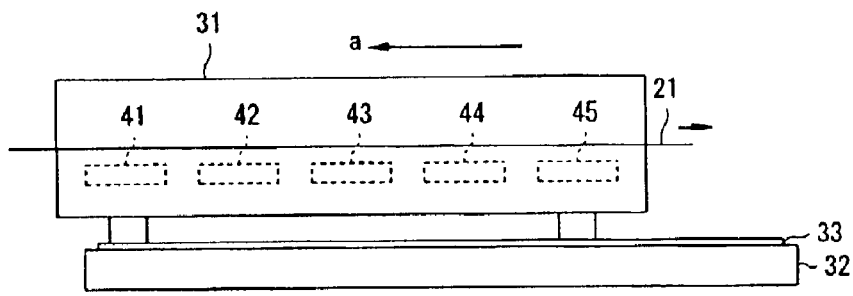

FIG. 2 is a side view illustrating an apparatus for manufacturing an electronic device in accordance with a second embodiment of the present invention.

Referring to FIG. 2(a), a reflow furnace 31 is supported by a supporting stand 32 having a rail 33. For example, the heating process and the cooling process are performed for the circuit substrate as a body to be heated, which is placed in a line on the tape substrate 21, in the reflow process performed after the soldering process and the mounting process. The reflow furnace 31 is provided with heater zones 41 to 44, which raise the temperature of the circuit substrate step-by-step, and a cooling zone 45, which performs a cooling process to lower the temperature of the circuit substrate. In addition, the reflow furnace 31 can simultaneously (as a batch) or separately perform the above process for a plurality of the circuit substrates which are placed in a line on the tape substrate 21.

In addition, as shown in FIGS. 2(b) and (c), the reflow furnace 31 can be moved on the rail 33 of the supporting stand 32 in either direction of double headed arrow a-b. The direction of arrow a-b is along the transport direction of the tape substrates 21. As such, the reflow furnace 31 can be moved along the direction of arrow a-b so that the heater zones 41 to 44 and the cooling zone 45 can be set at the position matching the product pitches of the circuit substrate.

Figure 3:
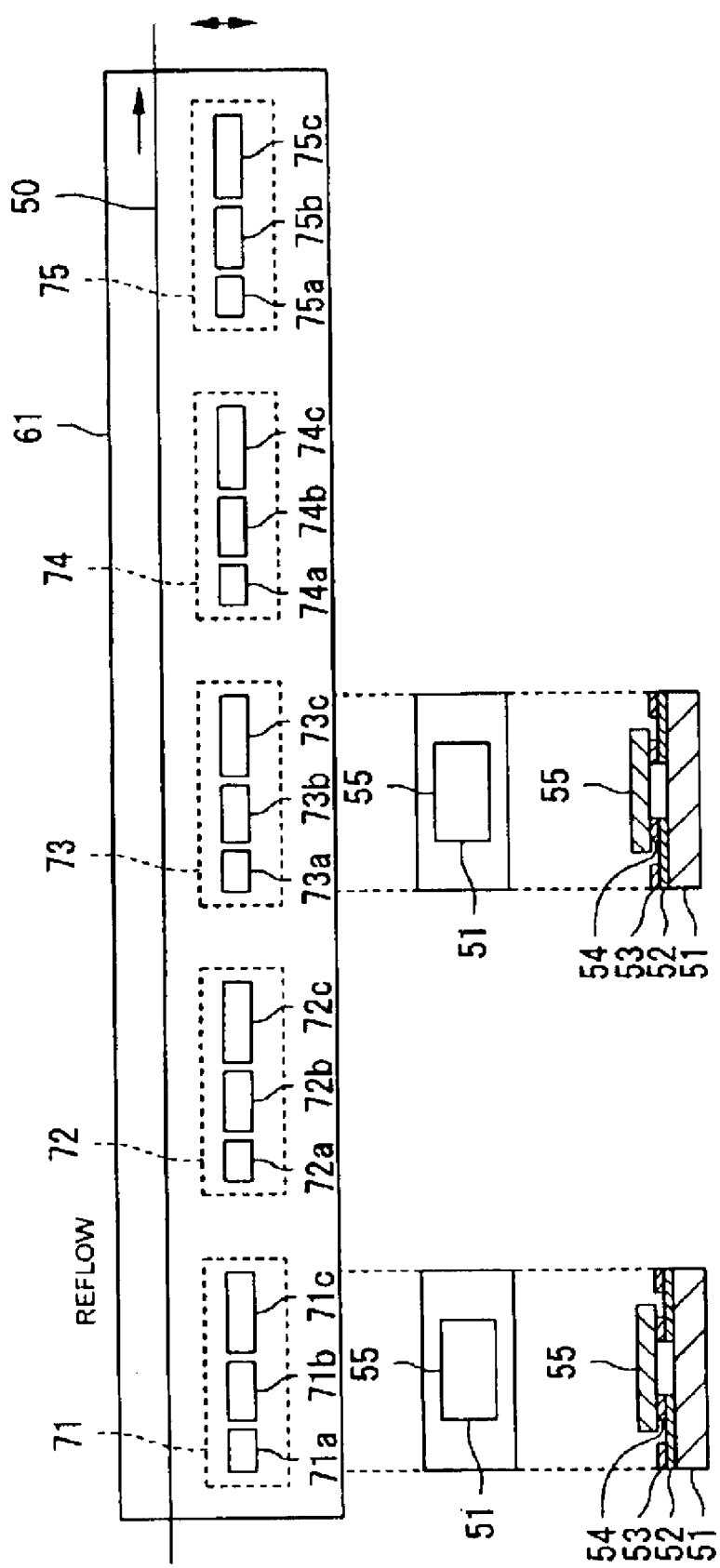
FIG. 3 is a view illustrating a method of manufacturing an electronic device according to a third embodiment of the present invention.
Figure 4:
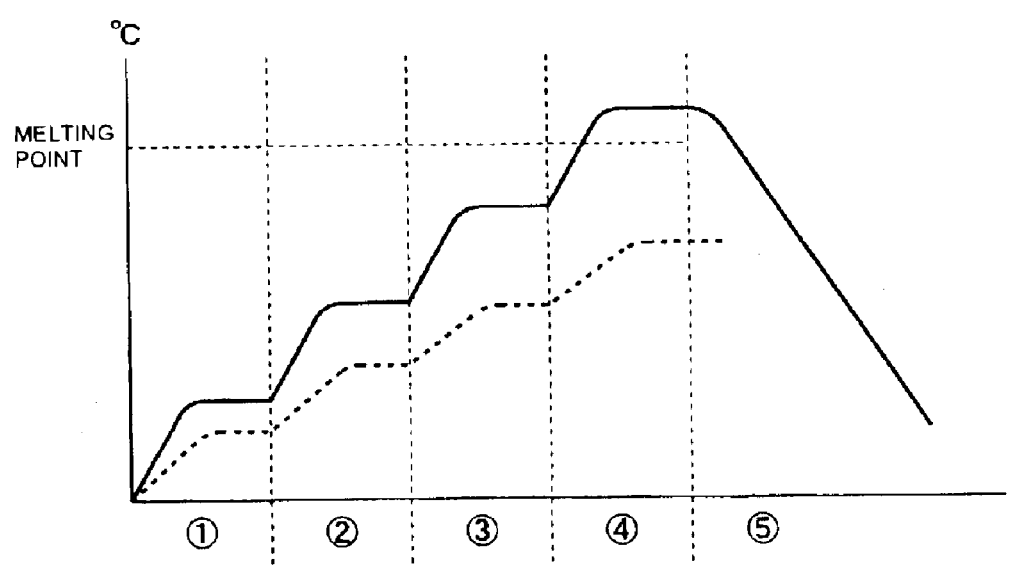
FIG. 4 is a view illustrating a temperature profile in the reflow process of FIG. 3.

FIG. 3 is a view illustrating a method for manufacturing an electronic device in accordance with a third embodiment of the present invention and FIG. 4 is a view illustrating a temperature profile of the reflow process of FIG. 3.

In FIGS. 3 and 4, the reflow furnace 61 can be moved along a transport direction of a tape substrate 50, and the reflow furnace 61 is provided with heater zones 71 to 74 and a cooling zone 75. A circuit substrate 51 is placed in a line on the tape substrate 50 as a continuous body which is carried along the right arrow direction in a predetermined tact. In the circuit substrate 51, a solder paste 54 is attached on a wiring 52 in the soldering process before the reflow process. In addition, an adhesive such as ACF can be attached on the wiring 52 by means of a transfer method. Reference numeral 54 indicates an insulating layer. In the mounting process after the soldering process, the semiconductor chip 55 is mounted on the circuit substrate 51 by the solder paste 54.

In addition, the heater zones 71 to 74 and the cooling zone 75 of the reflow furnace 61 are provided with heating blocks 71a to 71c, 72a to 72c, 73a to 73c, and 74a to 74c and cooling blocks 75a to 75c which are matched to the product pitches of the circuit substrate 51, respectively. Also, the product pitches refers to a mounting interval of ICs mounted on the circuit substrate 51, for example n (an integer) times 4.75 mm. When the integers are x, y, and z (x<y<z), the product pitch of 4.75·x corresponds to the heating blocks 71a, 72a, 73a, and 74a, and the cooling block 75a, the product pitch of 4.75·y corresponds to the heating blocks 71b, 72b, 73b, and 74b, and the cooling block 75b, and the product pitch of 4.75·z corresponds to the heating blocks 71c, 72c, 73c, and 74c, and the cooling block 75c.

The heating blocks 71a to 71c, 72a to 72c, 73a to 73c, and 74a to 74c and the cooling blocks 75a to 75c are independently moved upward and downward relative to the circuit substrate 51 by means of a driving mechanism (not shown). In other words, when the heating blocks 71a, 72a, 73a, and 74a, and the cooling block 75a are matched to the product pitches of the circuit substrate 51, the heating blocks 71a, 72a, 73a, and 74a, and the cooling block 75a are moved upward by means of the driving mechanism (not shown), and then contact the circuit substrate 51 having a predetermined block length on the tape substrate 50 to perform the heating process or the cooling process.

In addition, when any of the heating blocks 71a to 71c, 72a to 72c, 73a to 73c, and 74a to 74c and the cooling blocks 75a to 75c contact the circuit substrate 51, having the predetermined block length on the tape substrate 50, for the predetermined time to finish the heating process or the cooling process, they are moved downward and separated from the tape substrates 50. Such upward and downward movements of any of the heating blocks 71a to 71c, 72a to 72c, 73a to 73c, and 74a to 74c and the cooling blocks 75a to 75c and the transporting of the tape substrate 50 in the right arrow direction sequentially provide the preheating, the peak heating, and the cooling to the circuit substrate 51. The heating blocks 71a to 71c preheat the tape substrate 50, as shown by the solid line in region (1) of FIG. 4. The heating blocks 72a to 72c preheat the tape substrate 50, as shown by the solid line in region (2) of FIG. 4. The heating blocks 73a to 73c preheat the tape substrate 50, as shown by the solid line in region (3) of FIG. 4. The heating blocks 74a to 74c peak heat the tape substrate 50 to a solder melting temperature+α, as shown by the solid line in region (4) of FIG. 4. The cooling blocks 75a to 75c lower the temperature of the tape substrate 50, as shown by the solid line in region (5) of FIG. 4.

And, for example, when the tape substrate 50 on which the soldering process and the mounting process have been completed proceeds in the reflow process, the heater zones 71 to 74 and the cooling zone 75 perform the heating process and the cooling process for the circuit substrate 51 having the predetermined block length on the tape substrate 50. When the heating blocks 71a, 72a, 73a, and 74a, and the cooling block 75a are matched to the product pitch of the circuit substrate 51, the reflow furnace 61 slides along the transport direction of the tape substrate 50, and the heating blocks 71a, 72a, 73a, and 74a, and the cooling block 75 are fixed to the positions corresponding to the product pitches of the circuit substrate 51.

Next, the heating blocks 71a, 72a, 73a, and 74a, and the cooling block 75a are moved upward to contact the tape substrate 50. At this time, first, the heating block 71a for the circuit substrate 51 of the predetermined block length of the tape substrate 50 is contacted for a predetermined time to perform the heating process. By doing so, the preheating as shown by the solid line in region (1) of FIG. 4 is applied to the circuit substrate 51.

Here, when the heating block 71a contacts the circuit substrate 51 to perform the heating process only for the predetermined time, the circuit substrate 51 downstream of the tape substrate 50 is contacted with the heating blocks 72a, 73a, and 74a and cooling block 75a and the preheat, the peak heat and the cooling as indicated by the solid line in regions (2) to (5) of FIG. 4 are applied to the circuit substrate 51 downstream of the tape substrate 50. For this reason, the preheat, the peak heat, and the cooling can be simultaneously applied to the plurality of circuit substrates 51 which are placed in a line on the tape substrate 50 by means of the heating blocks 71a, 72a, 73a, and 74a and the cooling block 75a so that it is possible to enhance production efficiency.

If the heating process for the predetermined time is finished at the heating block 71a, the heating blocks 71a, 72a, 73a, and 74a and the cooling block 75a are separated from the tape substrate 50. Next, the tape substrate 50 is carried along the right arrow direction. At this time, the transport length is matched to the circuit substrate 51 of the predetermined block length on the tape substrate 50. When the circuit substrate 51, which had its heating process completed by means of the heating block 71a, reaches the position of the heating block 72a, the transporting of the tape substrate 50 is stopped, and the heating blocks 71a, 72a, 73a, and 74a and the cooling block 75a are moved upward again.

At this time, the heating block 72a is contacted with the circuit substrate 51 of the predetermined block length of the tape substrate 50 for a predetermined time to perform the heating process. By doing so, the preheating as shown by the solid line in region (2) of FIG. 4 is applied to the circuit substrate 51.

Here, when the heat block 72a contacts the circuit substrate 51 only for the predetermined time to perform the heating process, the circuit substrate 51 upstream of the tape substrate 50 is contacted with the heating block 71 a so that the preheating as shown by the solid line in region (1) of FIG. 4 is applied to the circuit substrate 51 upstream of the tape substrate 50 and the circuit substrate 51 downstream of the tape substrate 50 is contacted with the heating blocks 73a and 74a, and the cooling block 75a so that the peak heating and the cooling as shown by the solid lines in regions (3) to (5) of FIG. 4 are applied to the circuit substrate 51 downstream of the tape substrate 50.

If the heating process for the predetermined time is finished at the heating block 72a, the heating blocks 71a, 72a, 73a, and 74a and the cooling block 75a are separated from the tape substrate 50. Next, the tape substrate 50 is carried along the right arrow direction. When the circuit substrate 51 reaches the position of the heating block 73a after completion of the heating process by means of the heating block 72a, the transporting of the tape substrate 50 along the right arrow direction is stopped, and the heating blocks 71a, 72a, 73a, and 74a and the cooling block 75a are moved upward again. At this time, the heating block 73a for the circuit substrate 51 of the predetermined block length of the tape substrate 50 is contacted for a predetermined time to perform the heating process. By doing so, the preheating as shown by the solid line in region (3) of FIG. 4 is applied to the circuit substrate 51.

Here, when the heat block 73a contacts the circuit substrate 51 only for the predetermined time to perform the heating process, the circuit substrate 51 upstream of the tape substrate 50 is contacted with the heating blocks 71a and 72a so that the preheatings as shown by the solid lines in regions (1) and (2) of FIG. 4 are applied to the circuit substrate 51 upstream of the tape substrate 50 and the circuit substrate 51 downstream of the tape substrate 50 is contacted with the heating block 74a and the cooling block 75a so that the peak heating and cooling as shown by the solid lines in regions (4) to (5) of FIG. 4 are applied to the circuit substrate 51 downstream of the tape substrate 50.

When the heating process for the predetermined time is finished at the heating block 73a, the heating blocks 71a, 72a, 73a, and 74a and the cooling block 75a are separated from the tape substrate 50. Next, the tape substrate 50 is carried along the right arrow direction. When the circuit substrate 51 reaches the position of the heating block 74a after the heating process has been completed by means of the heating block 73a, the transporting of the tape substrate 50 along the right arrow direction is stopped, and the heating blocks 71a, 72a, 73a, and 74a and the cooling block 75a are moved upward again. At this time, the heating block 74a is contacted with the circuit substrate 51 of the predetermined block length on the tape substrate 50 for a predetermined time to perform the heating process. By doing so, the peak heating as shown by the solid line in region (4) of FIG. 4 is applied to the circuit substrate 51 so that the soldering paste 54 melts, and then the semiconductor chip 55 is attached to the wiring 52 on the circuit substrate 51.

Here, when the heat block 74a contacts the circuit substrate 51 only for the predetermined time to perform the heating process, the circuit substrate 51 upstream of the tape substrate 50 is contacted with the heating blocks 71a, 72a, and 73a so that the preheatings as shown by the solid lines in regions (1) to (3) of FIG. 4 are applied to the circuit substrate 51 upstream of the tape substrate 50. The circuit substrate 51 downstream of the tape substrate 50 is contacted with the cooling block 75a so that the cooling shown by the solid line in region (5) of FIG. 4 is applied to the circuit substrate 51 downstream of the tape substrate 50.

If the heating process for the predetermined time is finished at the heating block 74a, the heating blocks 71a, 72a, 73a, and 74a and the cooling block 75a are separated from the tape substrate 50. Next, the tape substrate 50 is carried along the right arrow direction. When the circuit substrate 51 reaches the position of the cooling block 75a after the heating process by means of the heating block 74a has been completed, the transporting of the tape substrate 50 along the right arrow direction is stopped, and the heating blocks 71a, 72a, 73a, and 74a and the cooling block 75a are moved upward again. At this time, the cooling block 75a is contacted with the circuit substrate 51 of the predetermined block length on the tape substrate 50 for a predetermined time to perform the cooling process. By doing so, the temperature of the circuit substrate 51 is lowered as shown by the solid line in region (5) of FIG. 4 so that the semiconductor chip 55 is fixed on the circuit substrate 51 through the wiring 52.

Here, when the cooling block 75a contacts the circuit substrate 51 only for the predetermined time to perform the cooling process, the circuit substrate 51 upstream of the tape substrate 50 is contacted with the heating blocks 71a, 72a, 73a, and 74a so that the preheating and the peak heating shown by the solid lines in regions (1) to (4) of FIG. 4 are applied to the circuit substrate 51 upstream of the tape substrate 50.

By doing so, the tape substrate 50 is carried along the right arrow direction so that the pre-heating, the peak heating, and the cooling are sequentially applied to the circuit substrate 51 having the predetermined block length, and then the reflow process for the circuit substrate 51 is completed.

Next, if the heating blocks 71c, 72c, 73c, and 74c, and the cooling block 75c are matched to the product pitches of the circuit substrate 51, the reflow furnace 61 slides along the transport direction of the tape substrate 50, and the heating blocks 71c, 72c, 73c, and 74c, and the cooling block 75c are fixed to the positions matching the product pitches of the circuit substrate 51. As a result, the heating process and the cooling process like the above are applied to the circuit substrate 51 on the predetermined block length of the tape substrate 50.

Further, while any of the heating blocks 71a to 71c, 72a to 72c, 73a to 73c, and 74a to 74c and the cooling blocks 75a to 75c that are matched to the product pitches of the circuit substrate 51 are held in contact with the tape substrate 50, the tape substrate 50 is carried in a predetermined tact and the preheating as shown by the solid lines in regions (1) to (3) of FIG. 4 and the peak heating shown by the solid lines in region (4) of FIG. 4 may be applied sequentially in the above reflow process.

Therefore, in the third embodiment, the reflow furnace 61 is slid along the transport direction of the tape substrate 50 and is fixed to the positions matching the product pitch of the circuit substrate 51 so that any of the heating blocks 71a to 71c, 72a to 72c, 73a to 73c, and 74a to 74c and the cooling blocks 75a to 75C can be matched to the product pitches of the circuit substrate 51.

As a result, different heating process times for circuit substrates 51 having different product pitches is not required, so that the reflow processes for the tape substrate 50 on which circuit substrates 51 having different product pitches are placed in a line can be continuously performed, and productivity can be enhanced.

In addition, because the heating process is performed by contacting any of the heating blocks 71a to 71c, 72a to 72c, 73a to 73c, and 74a to 74c and the cooling blocks 75a to 75c, which are matched to the product pitches of the circuit substrates 51, to the circuit substrates 51, it is possible to perform the heating processes in a plurality of units, which is different from a conventional spot-heating process.

Although the present embodiment is described in a case when four heating zones 71 to 74 are provided, the embodiment is not limited only to this arrangement and can be adapted to less or more heating zones.

Also, the present embodiment is described in the case that each heating zone 71 to 74 is provided with three heating blocks 71a to 71c, 72a to 72c, 73a to 73c, and 74a to 74c, however, the embodiment is not limited only to this case and can be adapted to less or more heating blocks.

Figure 5:
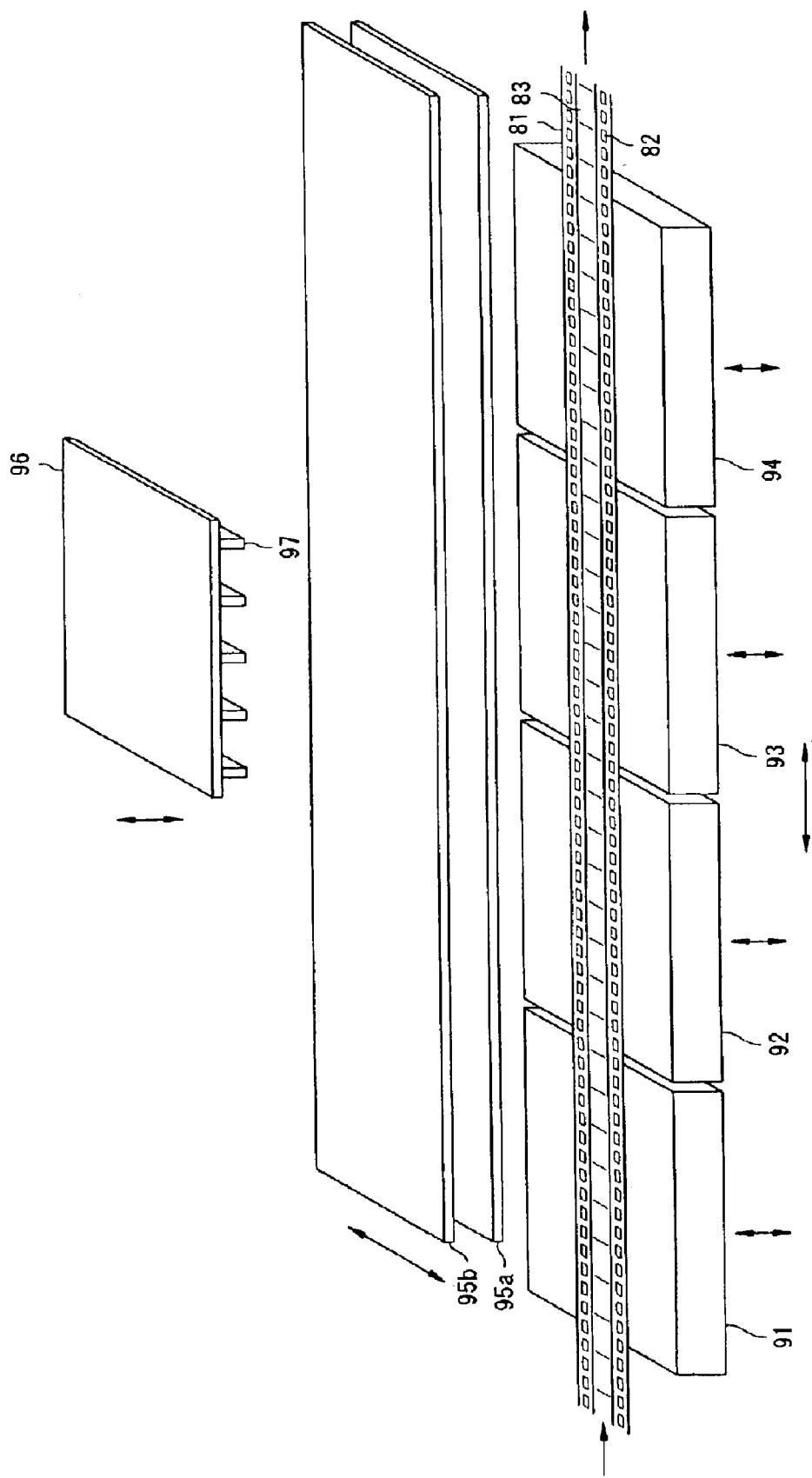
FIG. 5 is a view illustrating an apparatus for manufacturing an electronic device according to a fourth embodiment of the present invention.

FIG. 5 is a prospective view illustrating a schematic construction of an apparatus for manufacturing an electronic device according to the forth embodiment of the present invention.

In FIG. 5, circuit blocks 83 are provided in a longitudinal direction on a tape substrate 81, and electronic component mounting areas are provided on every circuit block 83. Feed holes 82 are provided on both sides of the tape substrate 81 at a predetermined pitch in order to transport the tape substrate 81. The material of the tape substrate 81 may be. For example, polyimide or the like. The electronic components mounted on each circuit block 83 may be, for example, semiconductor chips, chip condensers, resistance elements, coils, connectors, and the like.

Heating blocks 91 to 94 are consecutively arranged (in parallel) along the transport direction of the tape substrate 81 in the reflow zone of the tape substrates 81.

A pressing plate 96, to which at least one protruding portion or projection 97 is provided, is arranged over the heating block 93, and shutter plates 95a and 95b are arranged at the side of the heating blocks 91 to 94.

Here, the temperatures of the heating blocks 91 and 92 can be set to be raised sequentially with a range that is lower than the solder melting point, the temperature of the heating block 93 can be set to be higher than the solder melting point, and the temperature of the heating block 94 can be set to be lower than the temperatures of the heating blocks 91 and 92. Also, the heating blocks 91 to 94 and the pressing plate 96 can move independently upward and downward, and the shutter plates 95a and 95b can move horizontally in the lateral (i.e., short-side) direction of the tape substrate 81 and the heating blocks 91 to 94. Further, the shutter plates 95a and 95b, and the pressing plate 96 are supported to be able to slide together along the transport direction of the tape substrate 81. The interval of the protruding portions (97) provided on the pressing plates 96 may be set to correspond to the length of the circuit blocks 83.

Metals, metal compounds, alloy metal, or ceramics can be used as the material for the heating blocks 91 to 94 and the shutter plates 95a and 95b. Steel, stainless steel, or similar material can be used as the material for the heating blocks 91 to 94 so that it is possible to prevent thermal expansion of the heating blocks 91 to 94 and it is possible to accurately carry the tape substrate 81 to the heating blocks 91 to 94.

The length of each heating block 91 to 94 can be set to correspond to the length of the plurality of circuit blocks 83, the size of the shutter plates 95a and 95b can be set to the sum of the size of the four heating blocks 91 to 94 plus the size of the gap between the heating blocks 91 to 94, and the size of the pressing plate 96 can be set to correspond to the size of the heating block 93. It is not necessary to set the length of each heating block 91 to 94 to n times the size of one circuit block 83, but the addition of a margin value is acceptable.

Also, the shape of the heating blocks 91 to 94 may be set to flatten the contact surface of the tape substrate 81, and, for example, the heating blocks 91 to 94 can be constructed in the shape of plate.

Figure 7:
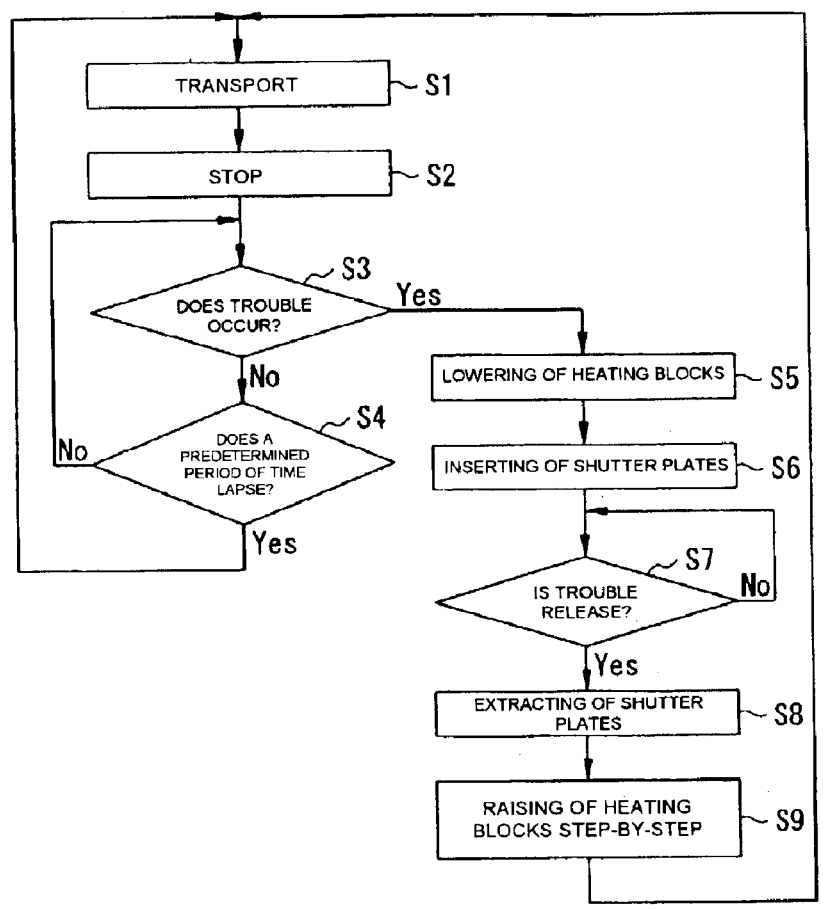
FIG. 7 is a flow chart illustrating the reflow process of FIG. 5.
Figure 8:
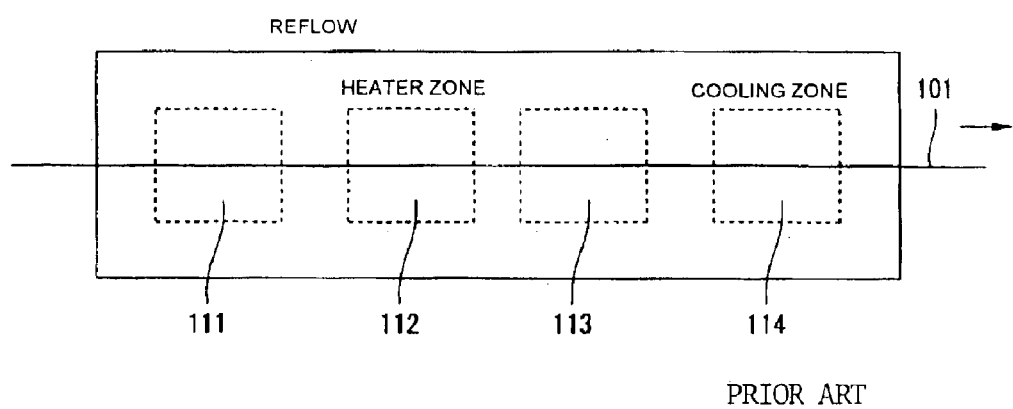
FIG. 8 is a view illustrating a conventional method of manufacturing an electronic device.

FIGS. 6(*a*)–6(*f*) are side views illustrating the reflow process of FIG. 5, and FIG. 7 is a flow chart illustrating the reflow process of FIG. 5.

In FIGS. 6 and 7, for example, the tape substrate 81, which was subjected to the solder paste printing and the mounting process of the electronic components in the solder applying zone 2 and the mounting zone 3 of FIG. 1, is carried on to the heating blocks 91 to 94 (step S1 in FIG. 7).

When carrying the tape substrate 81 on the heating blocks 91 to 94, it is possible to carry the tape substrate 81 while contacting the heating blocks 91 to 94. By doing so, when the heating blocks 91 to 94 contact the tape substrate 81 in order to heat the tape substrate 81, it is possible to omit the operation of moving the heating blocks 91 to 94, and it is possible to reduce the tact time of the reflow process. The heating blocks 91 to 94 are constructed in the shape of a plate so that it is possible to carry the tape substrate 81 smoothly while contacting the heating blocks 91 to 94.

Next, as shown in FIG. 6(*b*), when the tape substrate 81 subjected to the solder paste printing and the mounting process of the electronic devices is carried onto the heating blocks 91 to 94, the carrying of the tape substrate 81 is stopped only for a predetermined time (steps S2 and S4 in FIG. 7), and the tape substrate 81 is heated by means of each heating block 91 to 94. The heating blocks 91 to 94 are sequentially arranged in parallel along the transport direction of the tape substrate 81, the temperatures of the heating blocks 91 and 92 are set to be raised sequentially within a temperature range that is lower than the solder melting point, the temperature of the heating block 93 is set to be higher than the solder melting point, and the temperature of the heating block 94 is set to be lower than the temperature of the heating blocks 91 and 92.

For these reasons it is possible to perform the preheating process for the circuit block 83 on the heating blocks 91 and 92, to perform the main heating process (i.e., peak heating) for the circuit block 83 on the heating block 93, to perform the cooling process for the circuit block 83 on the heating block 94 and to perform the preheating, main (peak) heating, and the cooling processes simultaneously for different circuit blocks 83 on the tape substrate 81.

When the tape substrate 81 is stopped on the heating blocks 91 to 94, a pressing plate 96 moves down on the heating block 93 to press the circuit blocks 83 on the heating block 93 by the projections 97. By doing so, even when the tape substrate 81 is deformed into a, for example, wavy shape, it is possible to uniformly provide heat to the tape substrate 81, and it is also possible to stably perform the solder melting process. In addition, the interval of the projections 97 may correspond to the length of the circuit blocks 83 so that it is possible to press the circuit blocks 83 within a given boundary of the circuit blocks 83 and it is possible to prevent mechanical damage of electronic devices arranged on the circuit blocks 83.

Therefore, when a predetermined time elapses after the carrying of the tape substrate 81 is stopped, only a predetermined length of the tape substrate 81 is carried and a specific circuit block 83 on the tape substrate 81 is sequentially stopped on each heating block 91 to 94 so that it is possible to perform the preheating, main (peak) heating, and cooling processes simultaneously for the specific circuit blocks 83 on the tape substrate 81. For this reason, it is possible to raise the temperature of the specific circuit blocks 83 on the tape substrate 81 step-by-step, it is possible to perform the reflow process while suppressing thermal damage of the circuit blocks 83, and it is possible to rapidly drop the temperature of the solder melted circuit blocks 83 so that thermal oxidation of the solder can be controlled and product quality can be enhanced.

In addition, the specific circuit blocks 83 on the tape substrate 81 are sequentially contacted on each heating block 91 to 94, so that while clearly maintaining the difference of the temperatures at the boundary, it is possible to rapidly raise and drop the temperature of the circuit blocks 83 to rapidly bring the circuit blocks 83 to a setting temperature and it is possible to efficiently perform the reflow process.

For these reasons, as shown in FIG. 1, even though the reflow process is continuously performed after the solder applying process and the mounting process on the same tape substrate 81, it is possible to prevent the production efficiency from deterioration that is caused by delays in the reflow process, which further delay the solder applying process and the mounting process.

In other words, even though the solder applying process and the mounting process for the circuit blocks 83 in the solder applying zone 2 and the mounting zone 3 are completed, when the reflow process for the circuit blocks 83 in the reflow zone 4 has not been completed, the tape substrate 81 can not be moved until the reflow process for the circuit blocks 83 in the reflow zone 4 is completed. For this reason, when it takes a longer time to perform the reflow process than the solder applying process and the mounting process, it is necessary to delay the solder applying process and the mounting process for the circuit blocks 83 in the solder applying zone 2 and the mounting zone 3 until the reflow process for the circuit blocks 83 in the reflow zone 4 is completed. Thus, conversely, the operating efficiency of the solder applying zone 22 and the mounting zone 23 is lowered thereby lowering the production efficiency.

The tape substrate 81 contacts the heating blocks 91 to 94 so that it is possible to rapidly bring the temperature of the tape substrate 81 to a setting temperature, and it is possible to rapidly perform the reflow process. For these reasons, even though the solder applying process, the mounting process and the reflow process are performed simultaneously, it is possible to prevent the deterioration of operating efficiency of the solder applying zone 2 and the mounting zone 3 in FIG. 1, which is caused by delays in the reflow process. Thus, it is possible to enhance production efficiency.

Also, the plurality of heating blocks 91 to 94 are sequentially arranged (in parallel) along the transport direction of the tape substrate 81 so that it is possible to raise the temperature of the circuit blocks 83 step-by-step without increasing the corresponding time for the reflow process and it is possible to perform the reflow process while suppressing thermal damage.

For this reason, even though the solder applying process, the mounting process, and the reflow process are performed simultaneously, it is possible to optimize the temperature profile in the reflow process by preventing delays in the reflow process. Thus, it is possible to enhance production efficiency without deteriorating product quality.

The length of the tape substrate 81 carried by one transport tact, for example, can be adapted to corresponded to the length of the solder applying area (applied by one transport tact in the solder applying zone 2 in FIG. 1). And, the length of the solder applying area for one transport tact can be set to n (an integer) times the length of one circuit block 83.

In addition, the plurality of circuit blocks 83 are solder-applied simultaneously by one transport tact in the solder applying zone 2 in FIG. 1, so that it is possible to perform the reflow process simultaneously for the plurality of circuit blocks 83 step-by-step, and it is possible to enhance production efficiency without deteriorating product quality.

Also, it is not necessary to match the length of the solder applied area for one transport tact to the length of each heating block 91 to 94. Instead, the lengths of the heating blocks 91 to 94 may be longer than the length of the solder applied area for one transport tact. By doing so, even though the lengths of the circuit blocks 83 of the tape substrate 81 have been changed, it is possible to carry the tape substrate 81 while the specific circuit blocks 83 on all heating blocks 91 to 94 are heated longer than a predetermined time without exchanging the heating blocks 91 to 94, and it is possible to enhance production efficiency while suppressing the deterioration of product quality.

For example, the maximum value of the length of the solder applied area for one transport tact can be set to 320 mm, and the length of each heating block 91 to 94 can be set to 361 mm. And, one pitch of the feed holes 82 in FIG. 5 can be set to, for example, 4.75 mm, and the length of one circuit block 83 can be changed, for example, within a range of six to fifteen pitches of the feed holes 82. In this case, the length of the solder applied area for one transport tact can be set so that the number of circuit blocks 83 is maximized within the range where the maximum value does not exceed 320 mm. For example, if the length of one circuit block 83 is the length of eight pitches of the feed holes 82, then the length of one circuit block 83 is 4.75×8=38 mm, and the length of the solder applied area for one transport tact can be the length of eight circuit blocks 83=304 mm≦320 mm. For this reason, the length of the tape substrate 81 carried by one transport tact can be set to 304 mm.

In addition, when each heating block 91 to 94 is made longer than the length of the solder applied area for one transport tact and the length of the tape substrate 81 carried by one transport tact is set to the length of the solder applied area, at least part of the same circuit blocks 83 is stopped multiple times on the same heating block 91 to 94 so that a portion may be subjected to increased heating time. For this reason, the temperature of heating blocks 91 to 94 and tact time are set to have some margin, so that it is possible to maintain the quality of the reflow process.

Also, the heating blocks 91 to 94 are arranged to be separated by only a predetermined interval so that it is possible to clearly maintain the temperature at a boundary between the heating blocks 91 to 94, it is possible to uniformly maintain the setting temperature over all areas of the circuit blocks 83, and it is possible to uniformly maintain the product quality of the reflow process.

In addition, when the heating blocks 91 to 94 are arranged to be separated by-only a predetermined interval, an insulating resin such as Teflon (a registered trademark) may be provided at the gap between the heating blocks 91 to 94 so that it is possible to further lower thermal conductivity between the heating blocks 91 to 94.

Next, when, as shown in FIG. 6(c), some trouble occurs in the solder applying zone 2, the mounting zone 3, or elsewhere (FIG. 1 and step S3 in FIG. 7), the heating blocks 91 to 94 are lowered (step S5 in FIG. 7). Then, the shutter plates 95a and 95b are moved horizontally over the heating blocks 91 to 94, and the shutter plates 95a and 95b are positioned above and below the tape substrate 81, respectively (step S6 in FIG. 7) which places the shutter plates 95a and 95b over the heating blocks 91 to 94.

By doing so, for example, even though the movement of the tape substrate 81 is stopped for a long time, (because some trouble occurs in the solder applying zone 2, the mounting zone 3, or elsewhere) it is possible to prevent the prolonged heating of the tape substrate 81, and it is possible to reduce the thermal oxidation of the solder and contact failure.

In addition, the shutter plates 95a and 95b are positioned above and below the tape substrate 81, so that it is possible to make the temperature distribution above and below parts of the tape substrate 81 uniform, and it is possible to prevent the tape substrate 81 from being deformed into a, for example, wavy shape.

Next, as shown in FIGS. 6(d) to 6(f), when the trouble which occurred in the solder applying zone 2, the mounting zone 3, or elsewhere (FIG. 1 and step S7 in FIG. 7) is solved, the shutter plates 95a and 95b are retracted (step S8 in FIG. 7). Then, the positions of the heating blocks 91 to 94 are raised step-by-step (step S9 in FIG. 7), and the heating blocks 91 to 94 are contacted on the tape substrate 81.

By doing so, even though the tape substrate 81 on the heating blocks 91 to 94 is cooled, because the heating blocks 91 to 94 are temporarily separated from the tape substrate 81, it is possible to raise the temperature of the circuit blocks 83 on each heating block 91 to 94 step-by-step, while the movement of the tape substrate 81 is stopped.

For these reasons, it is not necessary to rewind the tape substrate 81 and to move the tape substrate 81 again in order to raise the temperature of the circuit blocks 83 on each heating block 91 to 94 step-by-step. Thus, it is possible to resume the reflow process without making the carrying system complicated.

In the above mentioned embodiments, although the method for retracting all the heating blocks 91 to 94 from the tape substrate 81 is described, it may be possible, for example, that only the heating block 93 is separated from the tape substrate 81, while the heating blocks 91, 92, and 94 remain in contact with the tape substrate 81. By doing so, even if some trouble occurs, for example, in the solder applying zone 2, the mounting zone 3, or elsewhere (FIG. 1), and even when the transport of the tape substrate 81 is stopped for a long time, it is possible to interrupt the main (peak) heating process while the preheating for the circuit blocks 83 of the tape substrate 81 continues, thus it is possible to reduce product failures.

Although in the embodiment in FIG. 5, a method in which only four heating blocks 91 to 94 are arranged in parallel is illustrated, it may be possible that more than five heating blocks 91 to 94 are arranged in parallel to perform the preheating for the circuit blocks 83 more smoothly or to perform the cooling of the circuit blocks 83 step-by-step.

In addition, although a method in which each heating block 91 to 94 is constructed as a plate is described, a concave portion may be provided on some of the contact surfaces of the heating blocks 91 to 94, for example, on a portion contacted on an area arranged with semiconductor chips, making it possible to prevent the heating blocks 91 to 94 from directly contacting the area arranged with the semiconductor chips. For these reasons, even in the case when semiconductor chips, which are vulnerable to heat, are mounted on the tape substrate 81, it is possible to suppress thermal damage of the semiconductors.

The entire disclosures of Japanese Patent Application Nos. 2002-081223 filed Mar. 22, 2002 and 2003-024651 filed Jan. 31, 2003 are incorporated by reference.

What is claimed is:

1. An apparatus for manufacturing an electronic device comprising:
   a moveable heat generating means for raising a temperature of an area of a continuous body to be heated by controlling a distance between said moveable heat generating means and said area of said continuous body to be heated; and
   position control means for controlling a position of said moveable heat generating means among a plurality of heat generating positions along a transport direction of said continuous body, said plurality of heat generating positions corresponding to a plurality of product pitches of said area of said continuous body to be heated.

2. The apparatus for manufacturing an electronic device according to claim 1, wherein said moveable heat generating means raises the temperature of said area of said continuous body to be heated by at least one of approaching and contacting at least a part of said area of said continuous body to be heated.

3. An apparatus for manufacturing an electronic device comprising:
   a moveable heat generating means for raising a temperature of an area of a continuous body to be heated by controlling a distance between said moveable heat generating means and said area of said continuous body to be heated, said moveable heat generating means including a plurality of contact areas having different predetermined temperatures; and
   position control means for controlling a position of said moveable heat generating means alone said continuous body based on product pitches of said area of said continuous body to be heated;
   wherein said moveable heat generating means raises the temperature of said area of said continuous body to be heated step-by-step by at least one of approaching and sequentially contacting said contact areas with at least a part of said area of said continuous body to be heated.

4. The apparatus for manufacturing an electronic device according to claim 3, wherein said plurality of contact areas further have different lengths corresponding to a plurality of different pitches of the product pitches of said area of said continuous body to be heated.

5. The apparatus for manufacturing an electronic device according to claim 3, wherein said plurality of contact areas having different predetermined temperatures are arranged in parallel along a transport direction of said continuous body.

6. An apparatus for manufacturing an electronic device comprising:
   a moveable heat generating means for raising a temperature of an area of a continuous body to be heated by controlling a distance between said moveable heat generating means and said area of said continuous body to be heated, said moveable heat generating means having a plurality of contact areas having different lengths corresponding to a plurality of different pitches of product pitches of said area of said continuous body to be heated; and position control means for controlling a position of said moveable heat generating means along said continuous body based on the product pitches of said area of said continuous body to be heated;

wherein said moveable heat generating means raises the temperature of said area of said continuous body to be heated by at least one of approaching and contacting at least a part of said area of said continuous body to be heated.

7. An apparatus for manufacturing an electronic device comprising:

a moveable heat generating means for raising a temperature of an area of a continuous body to be heated by controlling a distance between said moveable heat generating means and said area of said continuous body to be heated;

position control means for controlling a position of said moveable heat generating means along said continuous body based on product pitches of said area of said continuous body to be heated; and temperature lowering means for lowering the temperature of said area of said continuous body to be heated after the temperature of said area of said continuous body to be heated is raised by said heat generating means.

8. The apparatus for manufacturing an electronic device according to claim 7, wherein said temperature lowering means includes an area having a lower temperature than said heat generating means, and said temperature lowering means lowers the temperature of said area of said continuous body to be heated by contacting said lower temperature area with at least a part of said area of said continuous body to be heated.

9. The apparatus for manufacturing an electronic device according to claim 8, wherein said lower temperature area has a plurality of contact areas having different lengths corresponding to a plurality of different product pitches of said product pitches of said area of said continuous body to be heated.

* * * * *